United States Patent [19]

Isohata et al.

[11] 4,370,054
[45] Jan. 25, 1983

[54] PROJECTION EXPOSURE APPARATUS

[75] Inventors: Junji Isohata, Kawasaki; Hironori Yamamoto, Chigasaki, both of Japan

[73] Assignee: Canon Kabushiki Kaisha, Tokyo, Japan

[21] Appl. No.: 260,387

[22] Filed: May 4, 1981

[30] Foreign Application Priority Data

Apr. 2, 1981 [JP] Japan .................. 56-50364
Apr. 7, 1981 [JP] Japan .................. 56-52211

[51] Int. Cl.³ ............................................. G03B 27/42
[52] U.S. Cl. ...................................... 355/53; 355/86; 355/95
[58] Field of Search ............... 308/6 R, 35, DIG. 1; 355/53, 54, 72, 75, 86, 95; 350/86

[56] References Cited

U.S. PATENT DOCUMENTS 3,563,648 2/1971 Baggaley et al. .................. 355/534
3,722,996 3/1973 Fox .................................. 355/53
3,927,939 12/1975 Brady et al. ...................... 355/54

*Primary Examiner*—Richard A. Wintercorn
*Attorney, Agent, or Firm*—Fitzpatrick, Cella, Harper & Scinto

[57] ABSTRACT

A projection exposure apparatus in which a mask and a wafer are displaced in a plane perpendicular to the optical axis of the projection optical system to form circuit patterns on the entire surface of the wafer. The mask and wafer are displaced along guides having two guide rails between which are provided means for compensating for non-linearity of one of the guide rails.

6 Claims, 6 Drawing Figures

PROJECTION EXPOSURE APPARATUS

BACKGROUND OF THE INVENTION

1. Field of the Invention

The present invention relates to a projection exposure apparatus for producing semiconductor circuit devices such as integrated circuits, large-scale integrated circuits, very-large-scale integrated circuits etc., and more particularly to a printing apparatus utilizing a projection optical system for projecting an entire image or a partial image of a mask onto a wafer. The apparatus is adapted to displace the mask and wafer as a unit or either one thereof relative to said projection optical system thereby projecting the image of the mask onto the wafer.

2. Description of the Prior Art

An exposure apparatus capable of forming the image of a part of a mask on a wafer and displacing said image relative to the imaging optical system is already disclosed in the Japanese Patent Laid-Open Sho 54-53867 filed by the present applicant on Oct. 6, 1977. Also already known is a so-called stepper projection exposure apparatus capable of forming a reduced entire image of the mask onto a part of the wafer and stepwise displacing the wafer relative to the mask and the imaging optical system thereby printing a plurality of mask images on said wafer.

In such scanning projection exposure apparatus, the displacing member has to be properly positioned by guide means.

For example in the projection exposure apparatus disclosed in the above-mentioned Japanese Patent Laid-Open Sho 54-53867, a mask support member and a wafer support member integrally connected thereto are movably supported on two guide rails and displaced therealong. Thus if these guide rails are not precisely assembled, the mask and wafer will locally be two-dimensionally inclined relative to the optical system, thus resulting in local aberration of the mask image. For this reason the precision of linearity of two guide rails has to be strictly controlled.

SUMMARY OF THE INVENTION

The object of the present invention is to provide a projection exposure apparatus allowing relatively easy precision control.

The above-mentioned object is achieved according to the present invention by providing means for compensating for non-linearity of one guide member relative to another guide member.

Such compensation is achievable for example by constructing either one or both of said guide members with floating elements and reducing the rigidity of one of said floating elements thereby defining the scanning precision with the other floating member of a higher ridigity, or by providing a buffer member such as a spherical bearing between said guide members.

DESCRIPTION OF THE PREFERRED EMBODIMENTS

There will now be explained a first embodiment of the present invention with reference to the attached drawings.

Figure 1:
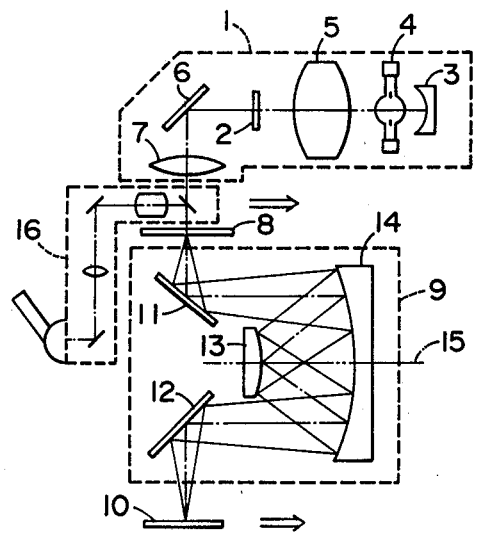
FIG. 1 is a schematic view showing the optical arrangement of a first embodiment of the present invention.

FIG. 1 shows the optical arrangement of said first embodiment, wherein an optical source system 1 for mask illumination comprises, along a horizontal optical axis 2, a spherical mirror 3, a mercury arc lamp 4, a lens 5, a 45° mirror 6 and a lens 7. Said system is further provided with an unrepresented filter for eliminating the light component actinic to the wafer, said filter being inserted into the optical path of said system during the alignment of the mask and wafer.

A mask 8 positioned in an upper horizontal plane is supported by an unrepresented mask support already known in the art. A mirror imaging optical system 9 for forming the image of said mask 8 onto a wafer 10 is composed of two 45° mirrors 11, 12, a convex mirror 13 and a concave mirror 14. Said convex and concave mirrors 13, 14 are positioned on a common optical axis 15 which is parallel to the upper and lower horizontal planes. The details of such mirror optical system are explained in the Japanese Patent Publication Sho 48-12039 and are therefore omitted from the present description.

The wafer 10 is supported by a known wafer support which is finely adjustable, in the known manner, in the X, Y and $\theta$ directions.

A microscope optical system 16 is insertable in the optical path between the lens 7 and mask 8 during the alignment in order to confirm that the mask 8 and the wafer 10 are in a predetermined mutually aligned relation. If they are not, such predetermined relation is reached by displacing the wafer, relative to the mask, in the X, Y and $\theta$ directions by the corresponding fine adjusting means.

Figure 2:
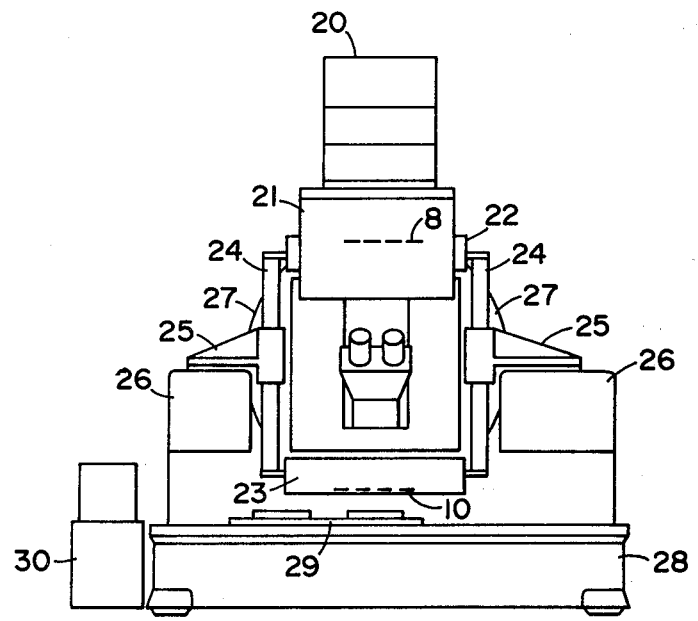
FIG. 2 is an external view of the apparatus shown in FIG. 1.

FIG. 2 shows the external view of the apparatus of the present invention, including a lamp house 20 housing the illuminating optical system shown in FIG. 1, a unit 21 housing the microscope optical system for alignment and rendered displaceable back and forth in the direction of the optical axis 15 shown in FIG. 1, a mask support 22, a wafer support 23, link members 24 for linking said supports for displacement thereof as a unit while allowing slight adjustment of said support 23 relative to said link members, arms 25 fixed to said link members 24 and so supported through fluid bearings by guide means 26 so as to allow integral and horizontally linear displacement of the mask and wafer supports 22, 23 along said guide means 26, a tube 27 housing the imaging optical system, a base 28, a turntable 29, and an automatic feeder 30 by which the wafer is supplied automatically onto the wafer support through said turntable 29.

Figure 3:
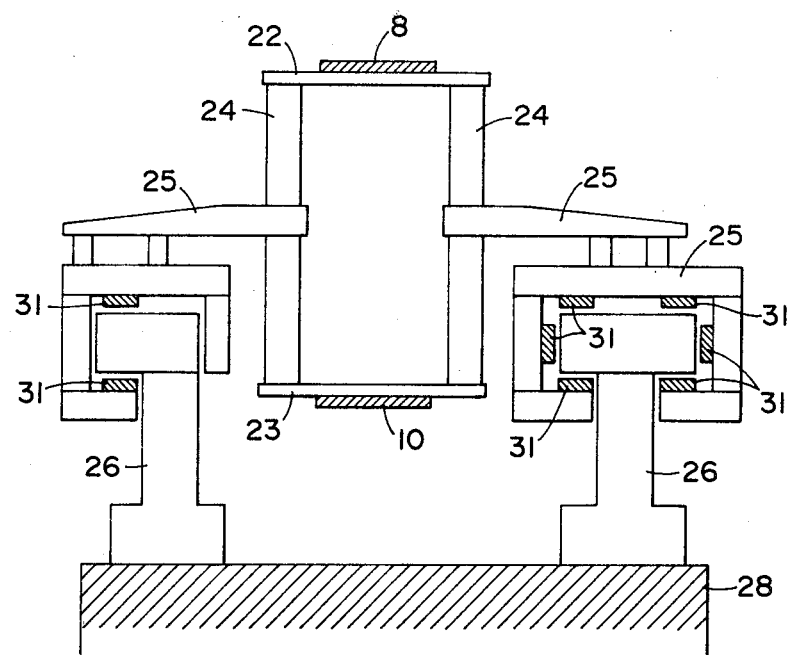
FIG. 3 is a cross-sectional view of the apparatus shown in FIG. 2.

FIG. 3 is a schematic cross-sectional view of the apparatus shown in FIG. 2, wherein the arms 25 are made to float by means of air bearings, having air pads 31, connected to an unrepresented pressurized air source and providing pressurized air streams. The right-hand arm 25 is provided with six air pads at top, bottom and lateral sides in the plane perpendicular to the direction of movement of the arms 25 as shown, to constitute an air bearing defined in all directions, while the left-hand arm 25 is provided with two air pads at top and bottom sides in the plane perpendicular to the direction of movement of the arms 25 to constitute an air bearing defined in the vertical direction.

Consequently the air bearing at the left has lower rigidity both in the vertical direction and in the lateral direction, in comparison with the air bearing at the right.

Figure 4:
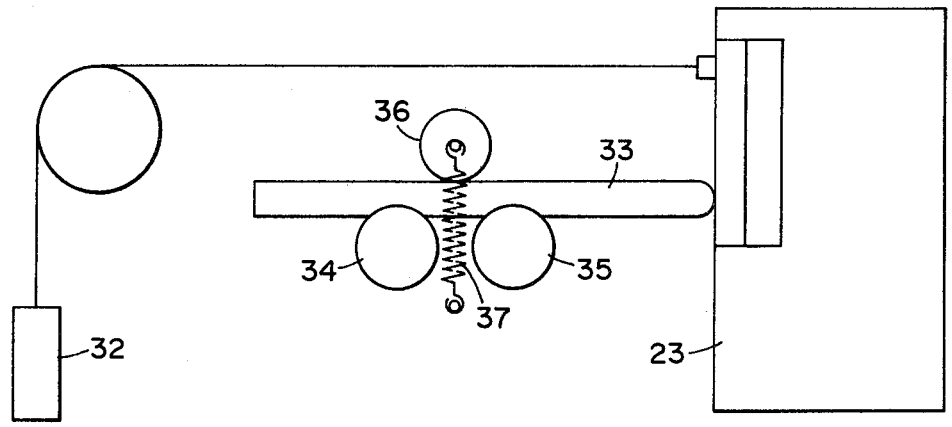
FIGS. 4 and 5 are views of displacing mechanism.
Figure 5:
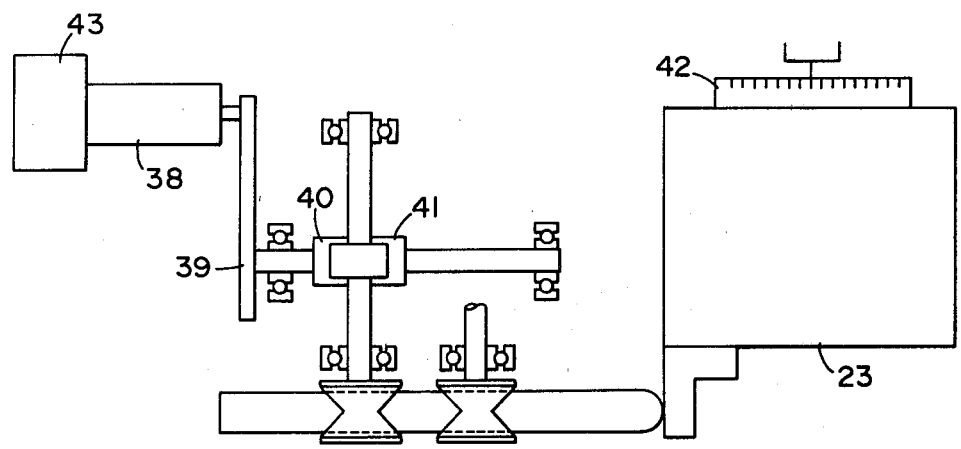

FIGS. 4 and 5 show illustrate the mechanism for displacing the floating mask and wafer supports 22, 23 along the guide members 26. The mask and wafer supports 22, 23 are biased toward the left in the drawing by a weight 32. A drive rod 33, for displacing the mask and wafer supports 22, 23 to the right, is driven to the right by a drive roller 34. There are also provided a guide roller 35 and another guide roller 36 biased by a spring 37 toward the drive roller.

The drive roller 34 is driven by a motor 38 shown in FIG. 5, the rotation of which is transmitted through a pulley 39, a worm gear 40 and a gear 41 and the rotating speed of which is controlled by a magnetic scale for detecting the position mounted on the mask and wafer supports 22, 23 and by a rotary encoder 43.

The above-explained apparatus functions in the following manner.

The alignment of the mutual positional relationship of the mask 8 and the wafer 10 is first performed as follows. During this alignment the aforementioned filter is inserted into the optical system 1 so that a sector-shaped image of the light source is formed by the non-actinic light on the mask through the lenses 5, 7. Also in this state the microscope optical system 16 is inserted between the lens 7 and the mask 8. The alignment is achieved by observing alignment marks on the mask 8 and wafer 10 through the microscope 16 and displacing the wafer support so as to match said alignment marks. After the completion of the alignment, said filter and microscope are retracted from the optical path, and simultaneously the light source 4 is extinguished or shielded by unrepresented shutter means. Subsequently the light source 4 is lighted or said shutter means is opened to form a sector-shaped image of the light source on the mask, whereby the image of the thus illuminated portion of the mask is formed on the wafer through the mirror optical system 13, 14. The motor 38 is activated in this state to displace the drive rod 33 at a constant speed, whereby the mask and wafer supports 22, 23 are displaced along the guide means 26. Said displacement can be performed without pitching or rolling despite eventual lack of precision of the left-hand guide 26 since the corresponding air bearing 31 is of a low rigidity while the air bearing at right is of a higher rigidity and the right-hand guide 26 is formed with a sufficient precision. In this manner the entire image of the mask is projected onto the wafer by said displacement.

In the foregoing embodiment the rigidity of an air bearing is increased by increasing the number of air pads thereof, but it is also possible to increase the ridigity by increasing the pressure of air streaming out from said air pads instead of changing the number thereof. Further it is possible to displace the optical system in place of the mask and wafer.

Figure 6:
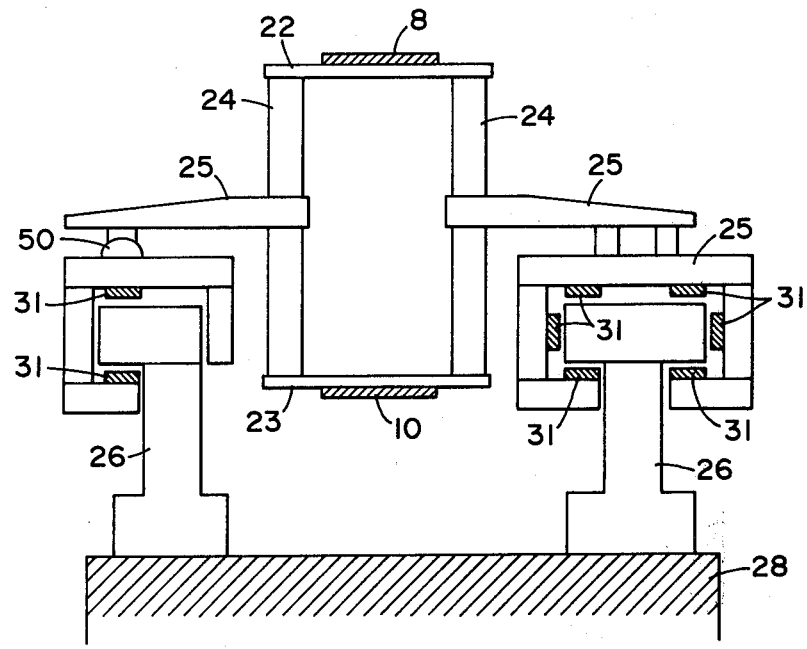
FIG. 6 is a view of a second embodiment of the present invention.

Now reference is made to FIG. 6 showing a second embodiment of the present invention in which the compensation is achieved by buffer means provided between the guides.

Such buffer means can be composed of a spherical seat performing buffer action in all directions, and a bearing functioning in one direction only or a slidable link which absorbs the vertical and/or horizontal vibration resulting from a guide member of lower precision, thereby enabling the displacement of at least one of the imaging optical system, mask support and wafer support along the guide member of the higher precision, without pitching or rolling.

In the embodiment shown in FIG. 6 the left-hand arm is provided with a spherical seat 50. Thus the vibration eventually caused by the lack of precision of the left-hand guide 26 is absorbed by the spherical seat 50 and does not create pitching or rolling since the air bearing 31 at the left is of low rigidity while the air bearing 31 at right is of high rigidity and the right-hand guide 26 is formed with sufficient precision.

What we claim is:

1. A projection exposure apparatus, comprising:
   a mask support member for supporting a mask;
   a wafer support member for supporting a wafer;
   a projection optical system for projecting the image of said mask onto a part of said wafer;
   guide means for displacing at least one of said mask and said wafer relative to said projection optical system in a plane perpendicular to the optical axis thereof, said guide means comprising first and second generally linear guide members and first and second guided members respectively engaging with said first and said second guide members; and
   compensating means provided between said first and said second guide members for compensating for non-linearity of one of said guide members.

2. A projection exposure apparatus according to claim 1, comprising floating means between at least one of said first and said second linear guide members and said corresponding first and second guided member.

3. A projection exposure apparatus according to claim 1, comprising floating means respectively between said first and said second linear guide members and said corresponding first and second guided members, one of said floating means being provided with a higher rigidity than the other of said floating means.

4. A projection exposure apparatus according to claim 3, wherein one of said floating means comprises a fluid bearing defined in all directions in one plane perpendicular to movement of said guided members and the other of said floating means comprises a fluid bearing defined in the vertical direction in one plane perpendicular to movement of said guided members.

5. A projection exposure apparatus according to claim 1, wherein said compensating means comprises buffer means.

6. A projection exposure apparatus according to claim 5, wherein said buffer means comprises a bearing.

* * * * *